(12) United States Patent
Lee

(10) Patent No.: US 7,605,419 B2
(45) Date of Patent: Oct. 20, 2009

(54) FLASH MEMORY DEVICE AND FABRICATING METHOD THEREOF

(75) Inventor: Sang Bum Lee, Inchun-shi (KR)

(73) Assignee: Dongbu HiTek Co., Ltd., Seoul (KR)

( * ) Notice: Subject to any disclaimer, the term of this patent is extended or adjusted under 35 U.S.C. 154(b) by 447 days.

(21) Appl. No.: 11/320,626

(22) Filed: Dec. 30, 2005

(65) Prior Publication Data

US 2006/0145236 A1   Jul. 6, 2006

(30) Foreign Application Priority Data

Dec. 30, 2004   (KR) .................. 10-2004-0117145

(51) Int. Cl.
*H01L 21/336* (2006.01)
(52) U.S. Cl. ............... 257/314; 257/E27.103; 438/264; 438/211
(58) Field of Classification Search ............... 257/314, 257/E21.602, E21.682, E27.103, 315, 317; 438/201, 211, 217, 257, 260, 263, 264, 593
See application file for complete search history.

(56) References Cited

U.S. PATENT DOCUMENTS

| | | | | |
|---|---|---|---|---|
| 6,232,635 | B1 * | 5/2001 | Wang et al. ............. | 257/318 |
| 6,605,840 | B1 * | 8/2003 | Wu ......................... | 257/315 |
| 6,781,186 | B1 * | 8/2004 | Wu ......................... | 257/315 |
| 6,914,291 | B2 * | 7/2005 | Wu ......................... | 257/317 |
| 7,335,938 | B2 * | 2/2008 | Sakuma et al. ......... | 257/314 |
| 7,397,093 | B2 * | 7/2008 | Sel et al. ................ | 257/390 |
| 2002/0068398 | A1 * | 6/2002 | Dong et al. ............. | 438/201 |
| 2004/0150032 | A1 * | 8/2004 | Wu ......................... | 257/315 |
| 2004/0197994 | A1 * | 10/2004 | Hung et al. ............ | 438/257 |
| 2004/0201058 | A1 * | 10/2004 | Sonoda et al. ......... | 257/314 |
| 2005/0199956 | A1 * | 9/2005 | Ding ...................... | 257/365 |
| 2006/0079045 | A1 * | 4/2006 | Kim et al. .............. | 438/197 |
| 2006/0138525 | A1 * | 6/2006 | Yoon ...................... | 257/315 |
| 2006/0145251 | A1 * | 7/2006 | Ko ......................... | 257/337 |

* cited by examiner

*Primary Examiner*—W. David Coleman
*Assistant Examiner*—Latanya Crawford
(74) *Attorney, Agent, or Firm*—Sherr & Vaughn, PLLC

(57) ABSTRACT

A flash memory device includes a floating gate formed on a substrate, sidewall gates formed on sidewalls of the floating gate, an interlayer insulating layer formed the floating gate and the sidewall gates, and a control gate formed on the interlayer insulating layer. The fabricating method of a flash memory device includes forming a floating gate on a substrate, forming sidewall gates at sidewalls of the floating gate, forming an interlayer insulating layer on the floating gate and the sidewall gates, and forming a control gate on the interlayer insulating layer.

14 Claims, 16 Drawing Sheets

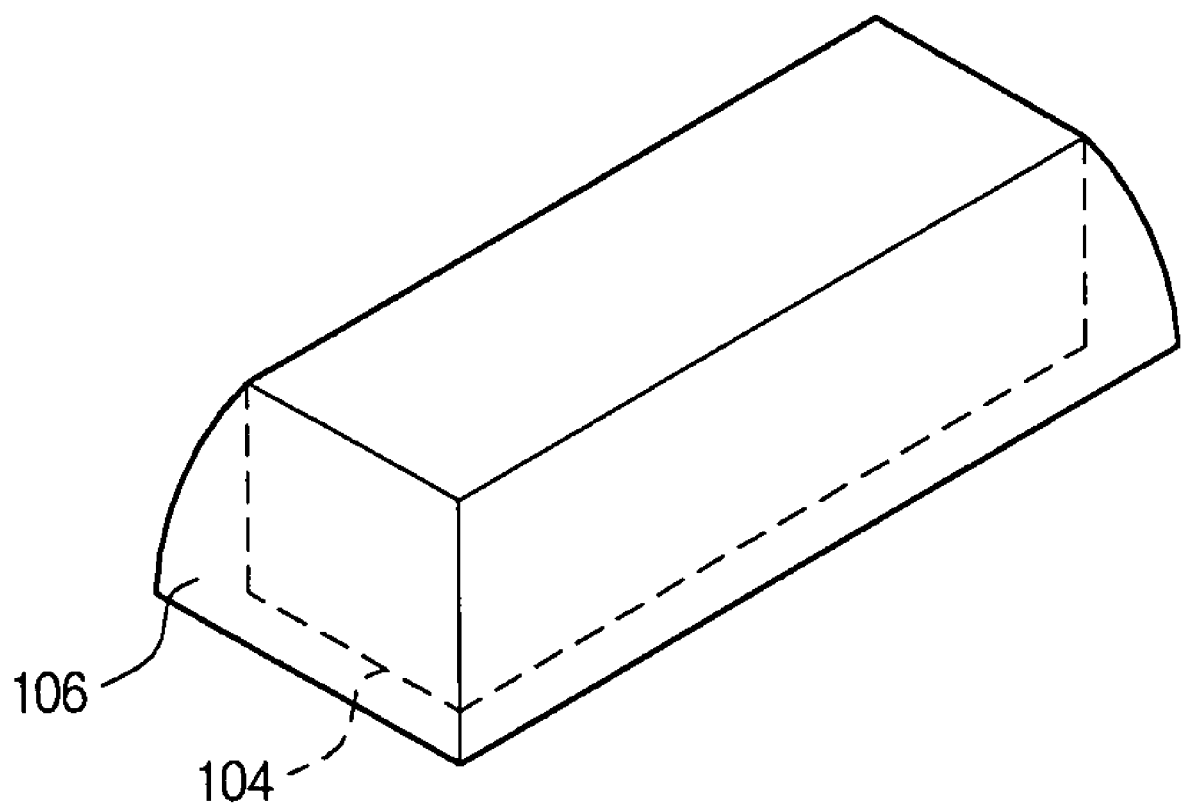

FLASH MEMORY DEVICE AND FABRICATING METHOD THEREOF

BACKGROUND OF THE INVENTION

1. Field of the Invention

The present invention relates to a flash memory device and a fabricating method thereof.

2. Description of the Related Art

There are various kinds of semiconductor memory devices. Among them, flash memory devices are drawing attraction. A flash memory device will be described below.

FIGS. 1 to 3 are plan views illustrating sequential procedures of fabricating a related art flash memory device, and FIGS. 4 to 6 are sectional views taken along line A-A' of FIGS. 1 to 3, respectively.

Referring to FIGS. 1 and 4, trench insulating layers 12 are formed on a silicon substrate 10 to thereby define an active region 13. That is, the active region 13 is defined as a region where the trench insulating layers 12 are not formed.

Referring to FIGS. 2 and 5, a floating gate 14 is formed in the active region 13 on the silicon substrate 10. The floating gate 14 is formed by depositing a conductive layer on an entire surface of the silicon substrate 10 and patterning the deposited conductive layer. A reference numeral 15 represents a selection gate.

Referring to FIGS. 3 and 6, an interlayer insulating layer 16 and a control gate 18 are formed on the floating gate 14. The interlayer insulating layer 16 may be an oxide/nitride/oxide (ONO) layer. The control gate 18 is formed by depositing a conductive layer on an entire surface of the silicon substrate 10 and patterning the deposited conductive layer.

In such a flash memory, however, probability that electrons will move to the control gate 18 at a sharp edge of the floating gate 14 is increased. This represents that the electrons retained in the floating gate 14 move to the control gate 18, and it also means data loss. Consequently, the reliability of data retention in the flash memory device is degraded.

SUMMARY OF THE INVENTION

Accordingly, the present invention is directed to a flash memory device and a fabricating method thereof that substantially obviate one or more problems due to limitations and disadvantages of the related art.

An object of the present invention is to provide a flash memory device capable of improving the reliability of data retention, and a fabricating method thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a flash memory device including: a floating gate formed on a substrate; sidewall gates formed on sidewalls of the floating gate; an interlayer insulating layer formed the floating gate and the sidewall gates; and a control gate formed on the interlayer insulating layer.

In another aspect of the present invention, there is provided a fabricating method of a flash memory device, including: forming a floating gate on a substrate; forming sidewall gates at sidewalls of the floating gate; forming an interlayer insulating layer on the floating gate and the sidewall gates; and forming a control gate on the interlayer insulating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 16 is a perspective view of a floating gate of the flash memory according to the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 7 to 10 are plan views illustrating sequential procedures of fabricating a flash memory device according to the present invention, and FIGS. 11 to 14 are sectional views taken along line A-A' of FIGS. 7 to 10, respectively.

Figure 1:
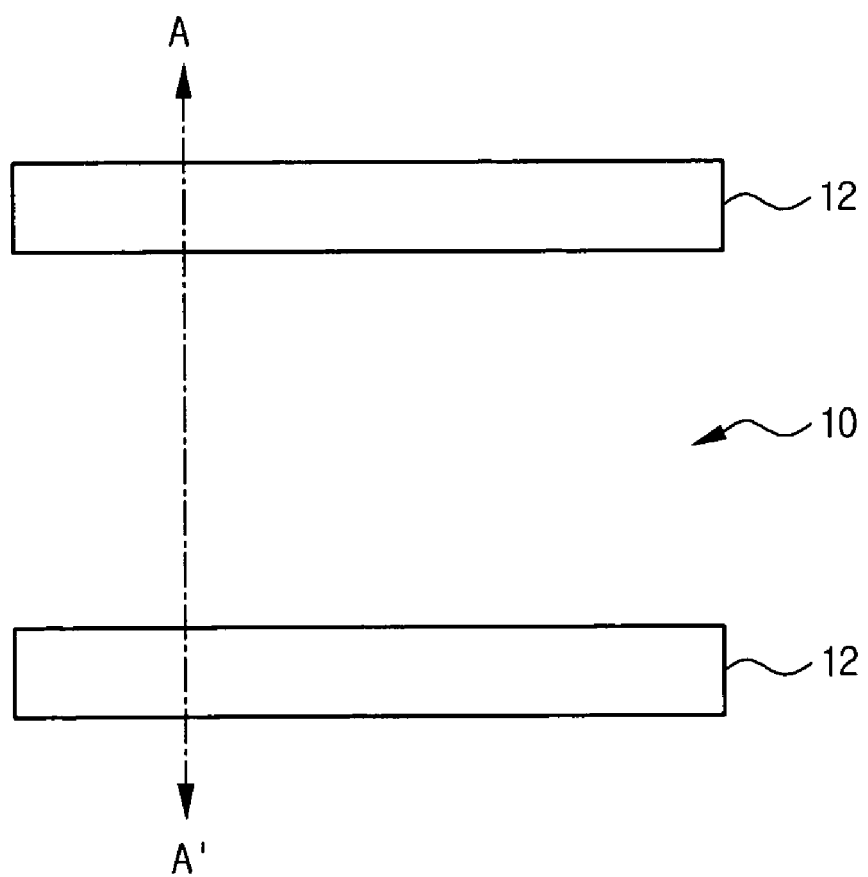
FIGS. 1 to 3 are plan views illustrating sequential procedures of fabricating a related art flash memory device.
Figure 2:
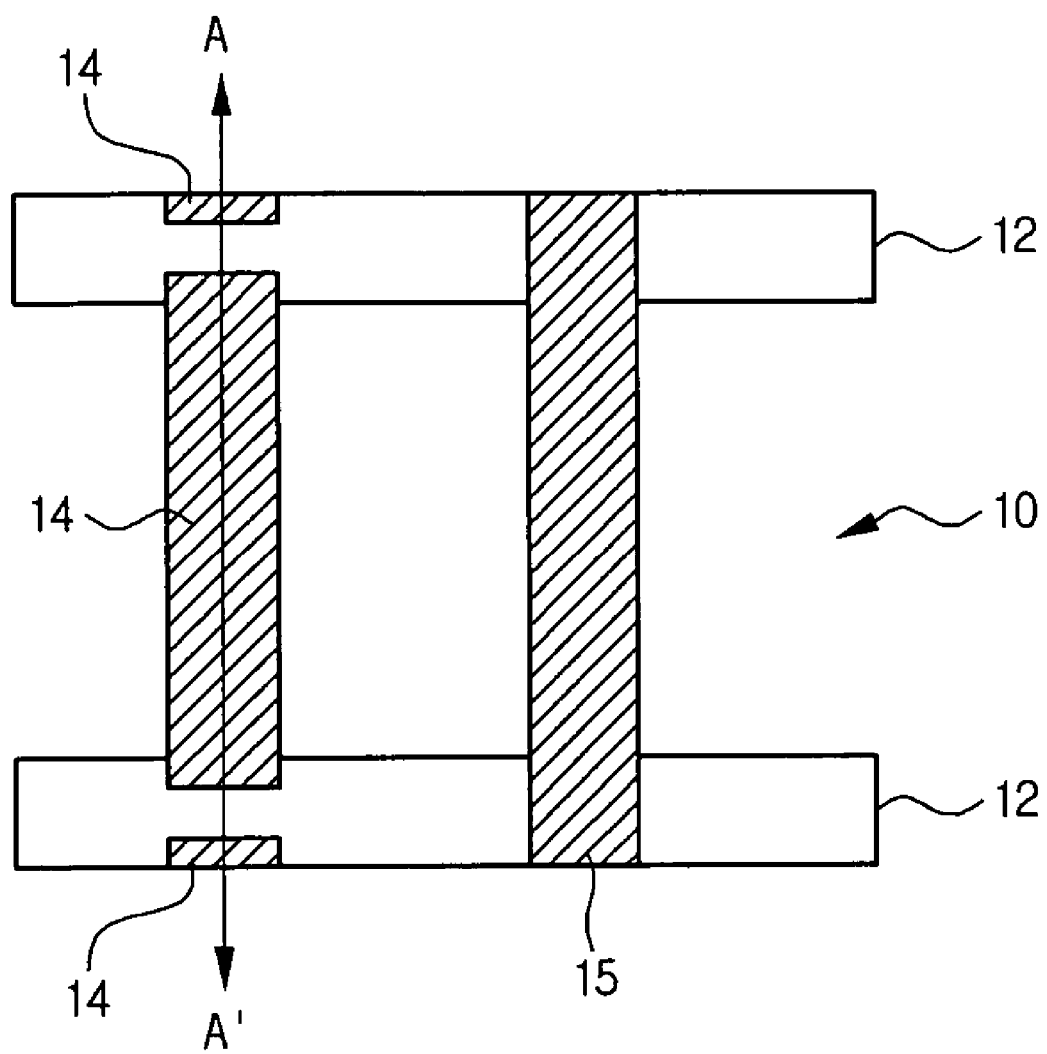
Figure 3:
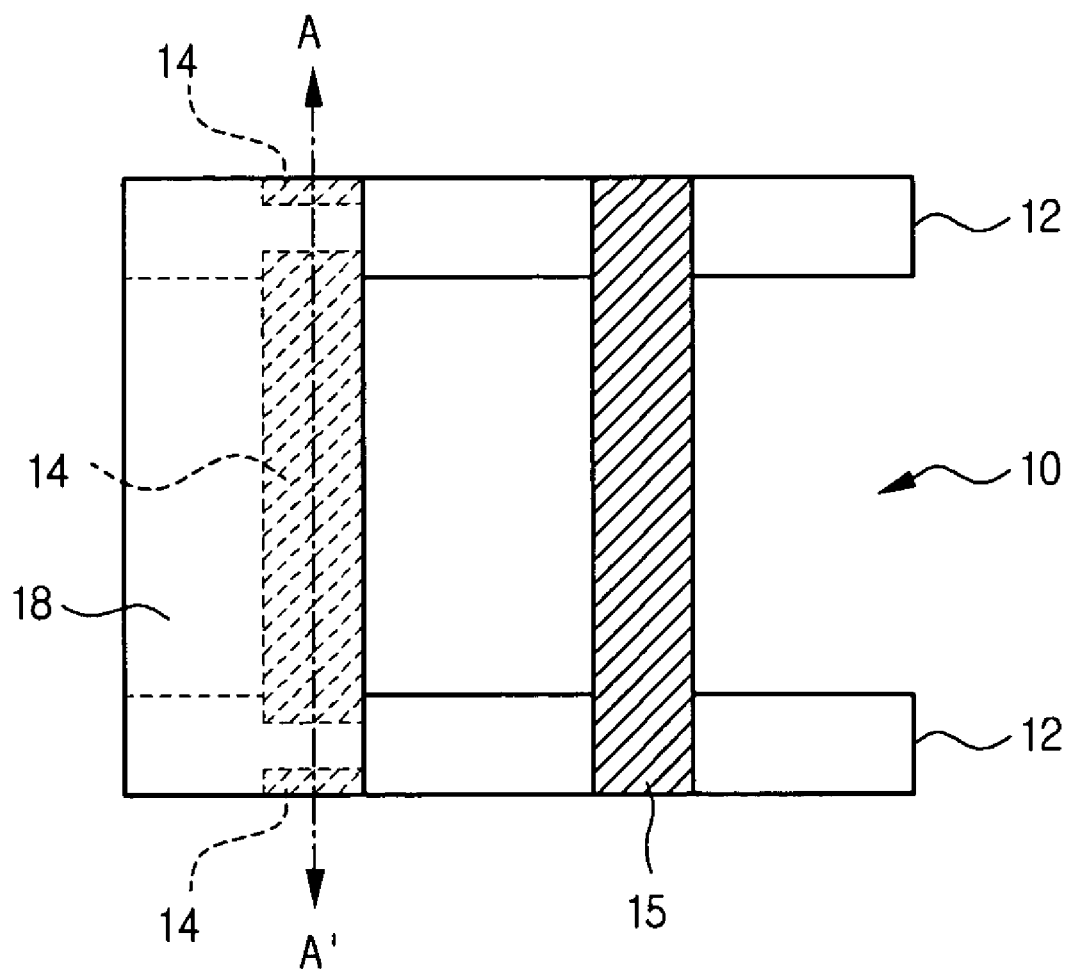
Figure 4:
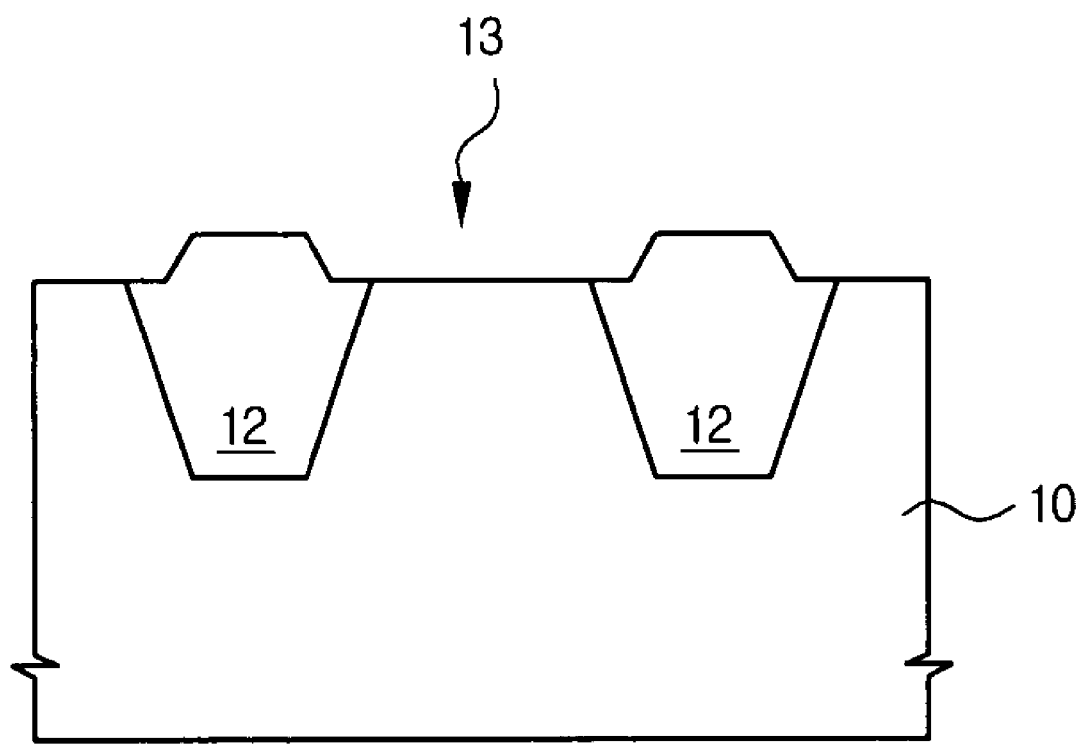
FIGS. 4 to 6 are sectional views taken along line A-A' of FIGS. 1 to 3, respectively.
Figure 5:
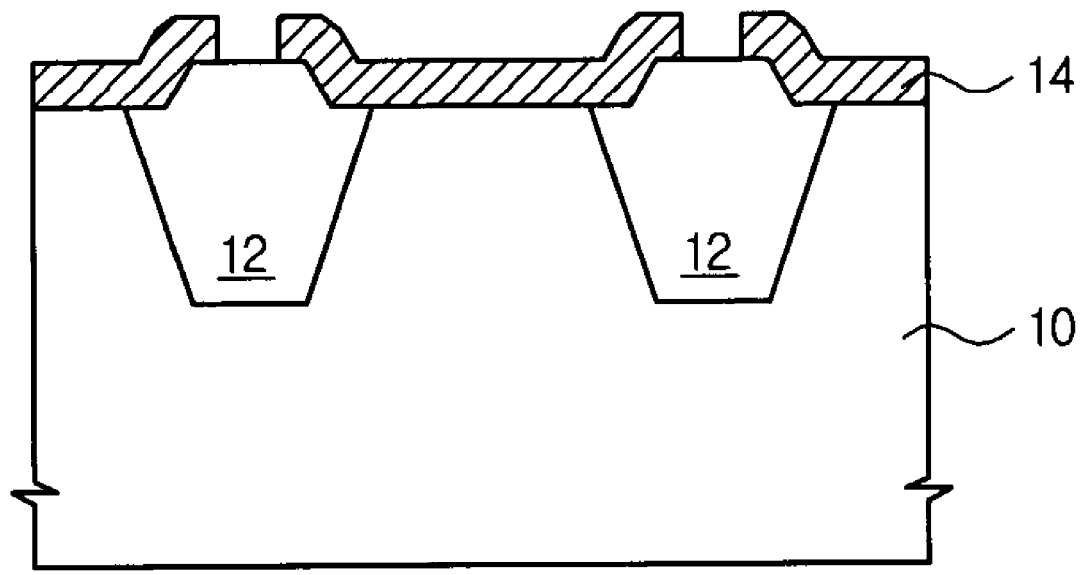
Figure 6:
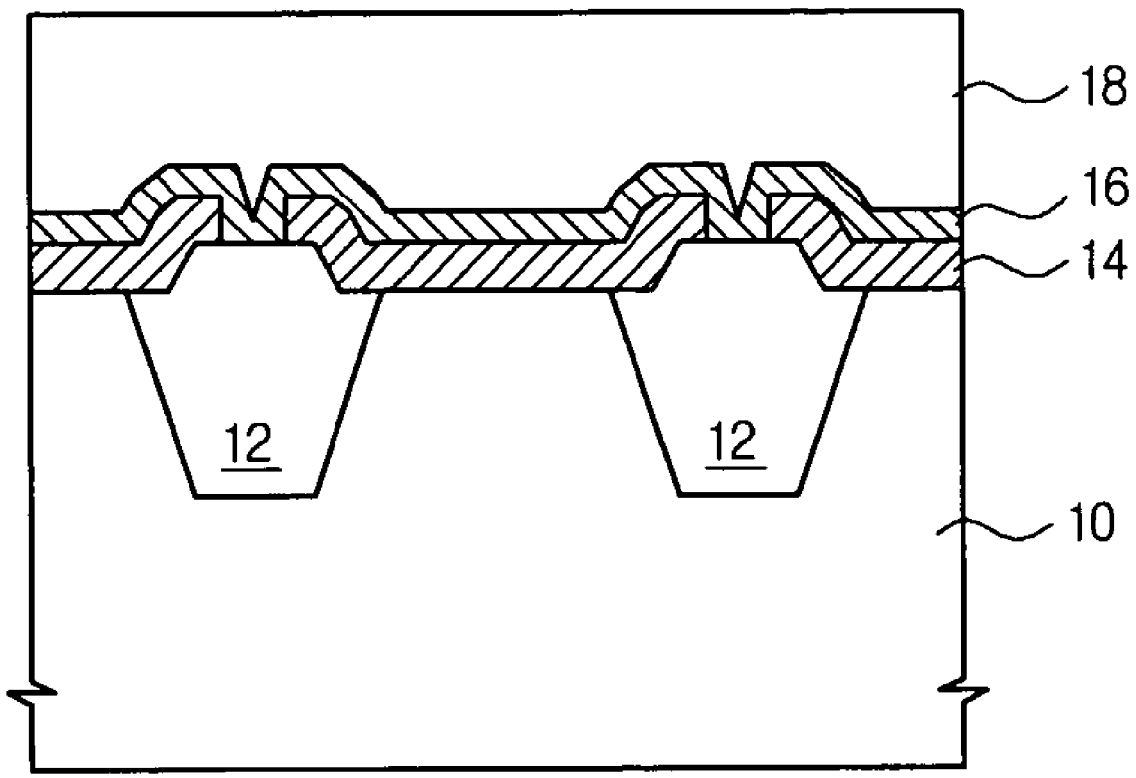
Figure 7:
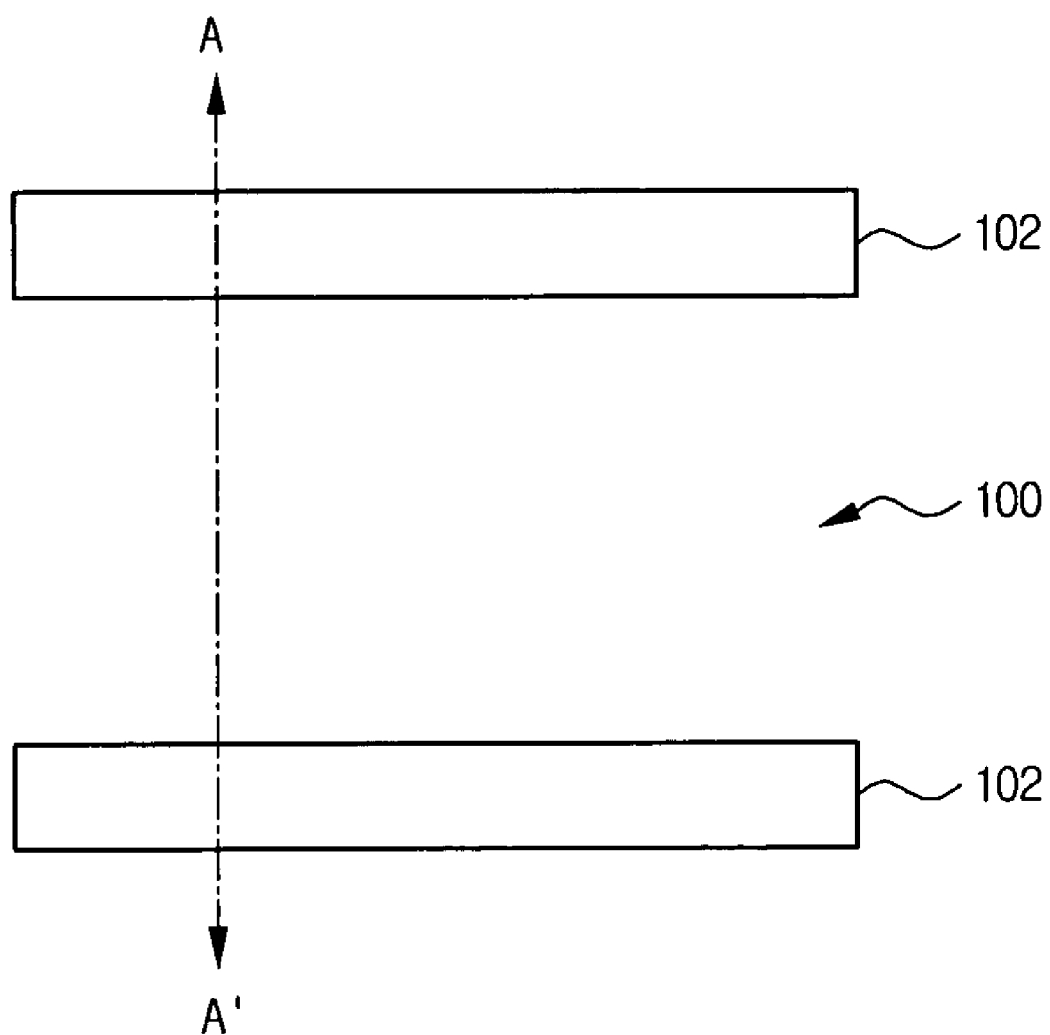
FIGS. 7 to 10 are plan views illustrating sequential procedures of fabricating flash memory device according to the present invention.
Figure 11:
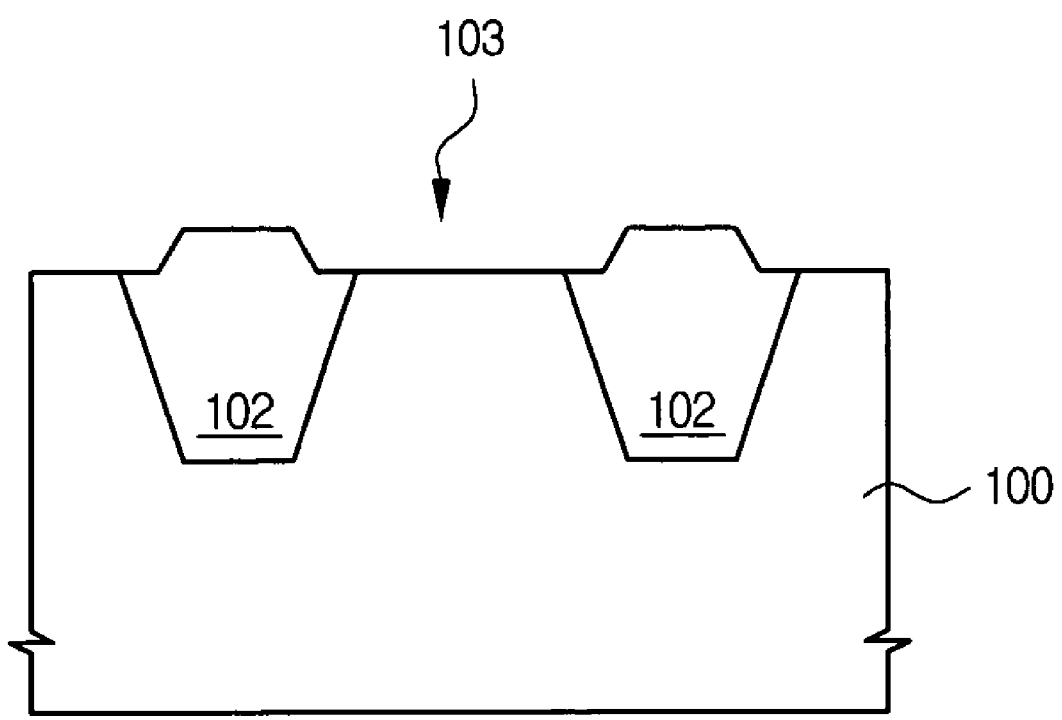
FIGS. 11 to 14 are sectional views taken along line A-A' of FIGS. 7 to 10, respectively.

Referring to FIGS. 7 and 11, trench insulating layers 102 are formed on a substrate 100 (e.g., a silicon substrate) to thereby define an active region 103. That is, the active region 103 is defined as a region where the trench insulating layers 102 are not formed.

Figure 8:
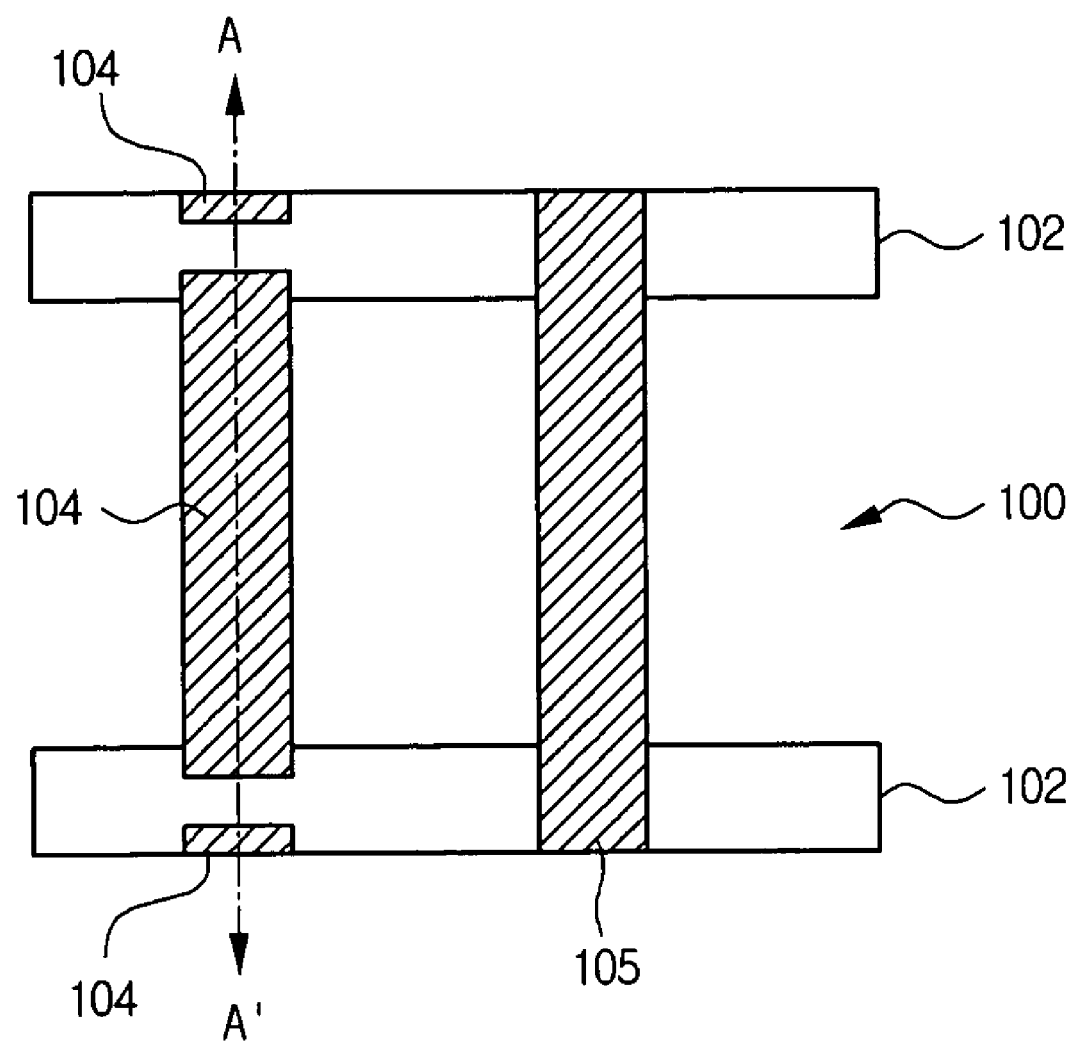
Figure 12:
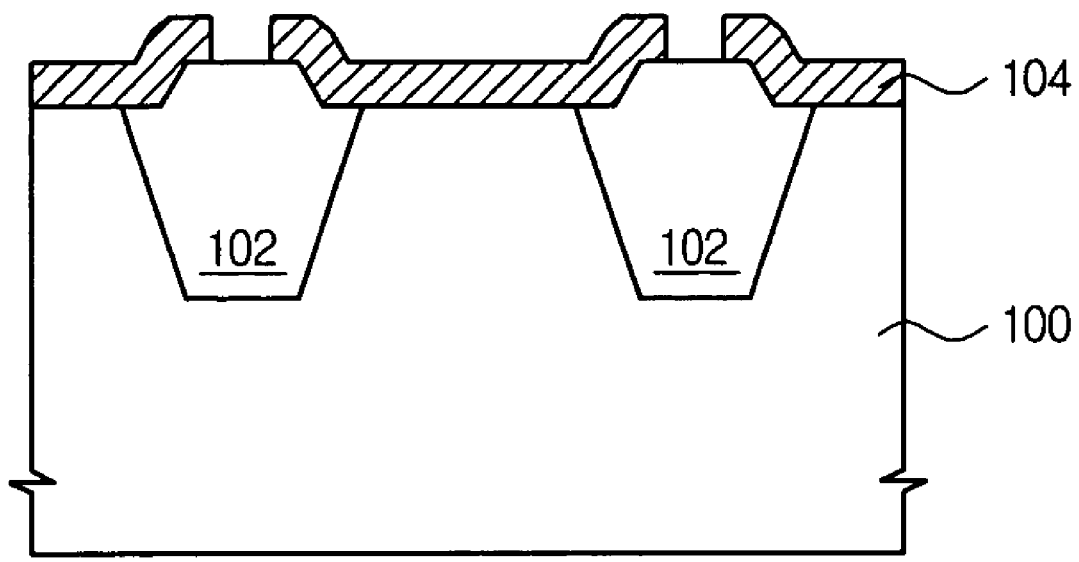

Referring to FIGS. 8 and 12, a floating gate 104 is formed in the active region 103 on the substrate 100. The floating gate 104 is formed by depositing a conductive layer on an entire surface of the substrate 100 and patterning the deposited conductive layer. A reference numeral 105 represents a selection gate.

Figure 9:
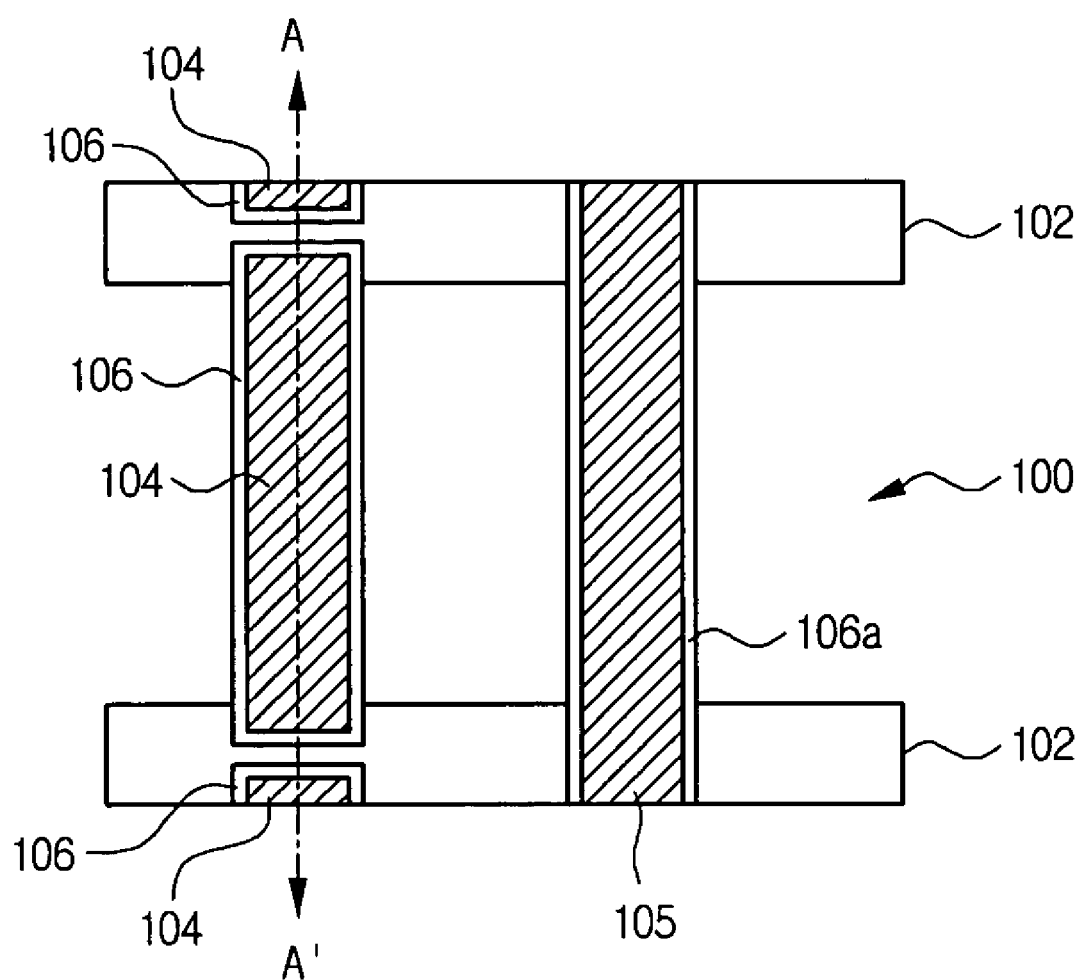
Figure 13:
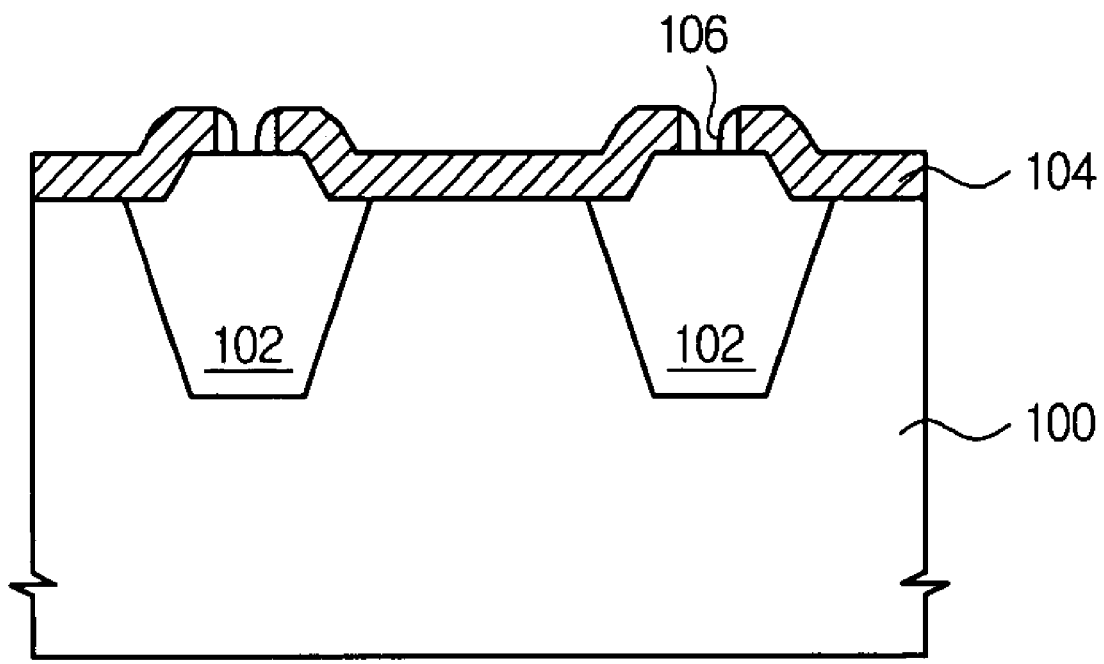

Referring to FIGS. 9 and 13, a sidewall gate 106 is formed at sidewalls of the floating gate 104. The sidewall gate 106 may be formed of polysilicon. A reference numeral 106a represents a second sidewall gate formed at sidewalls of the selection gate 105.

The sidewall gate 106 can be formed by the following processes. First, a polysilicon layer is formed on the floating gate 104. A patterned mask is formed on the polysilicon layer. The mask may be formed of photoresist and patterned using a photolithography process. The sidewall gate 106 is formed by an etching process using the patterned mask. A dry etching process may be used as the etching process.

Figure 10:
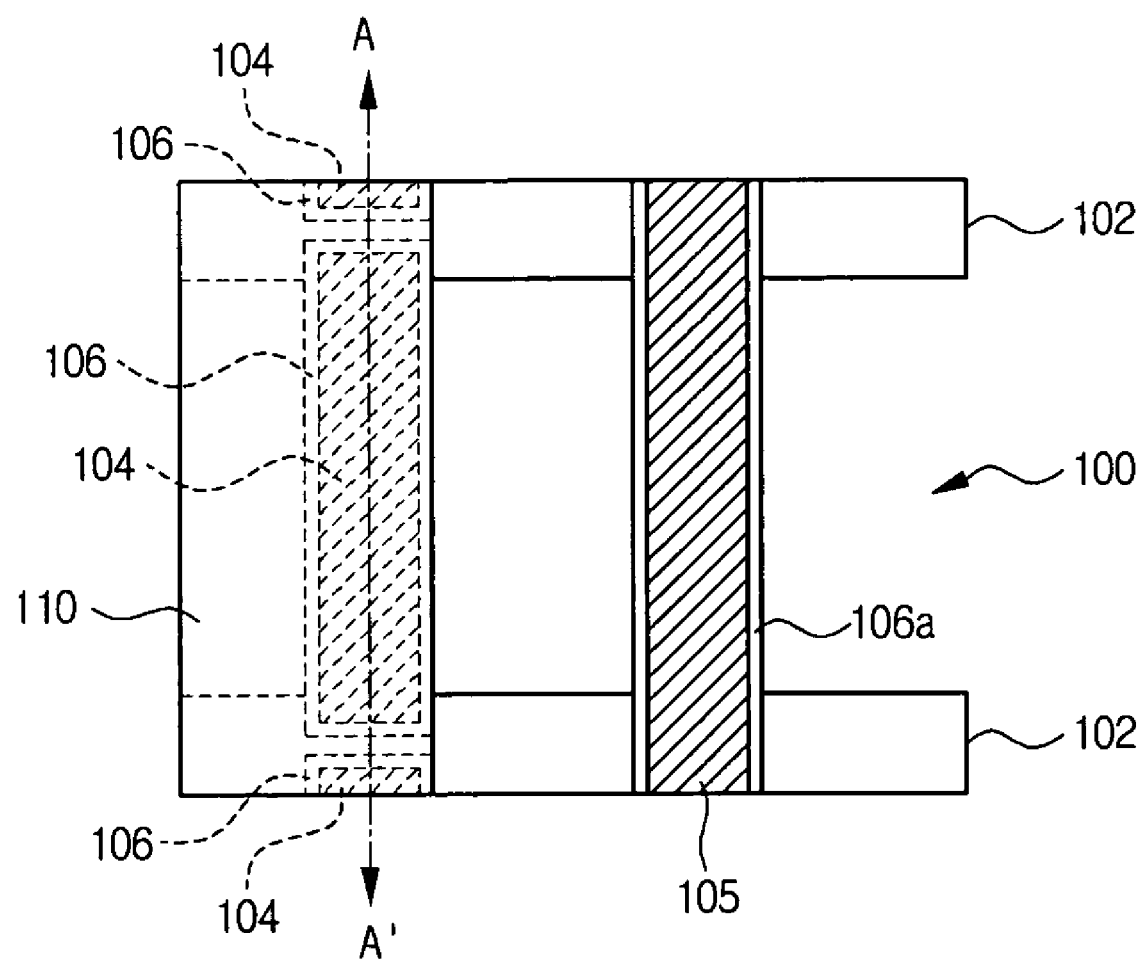
Figure 14:
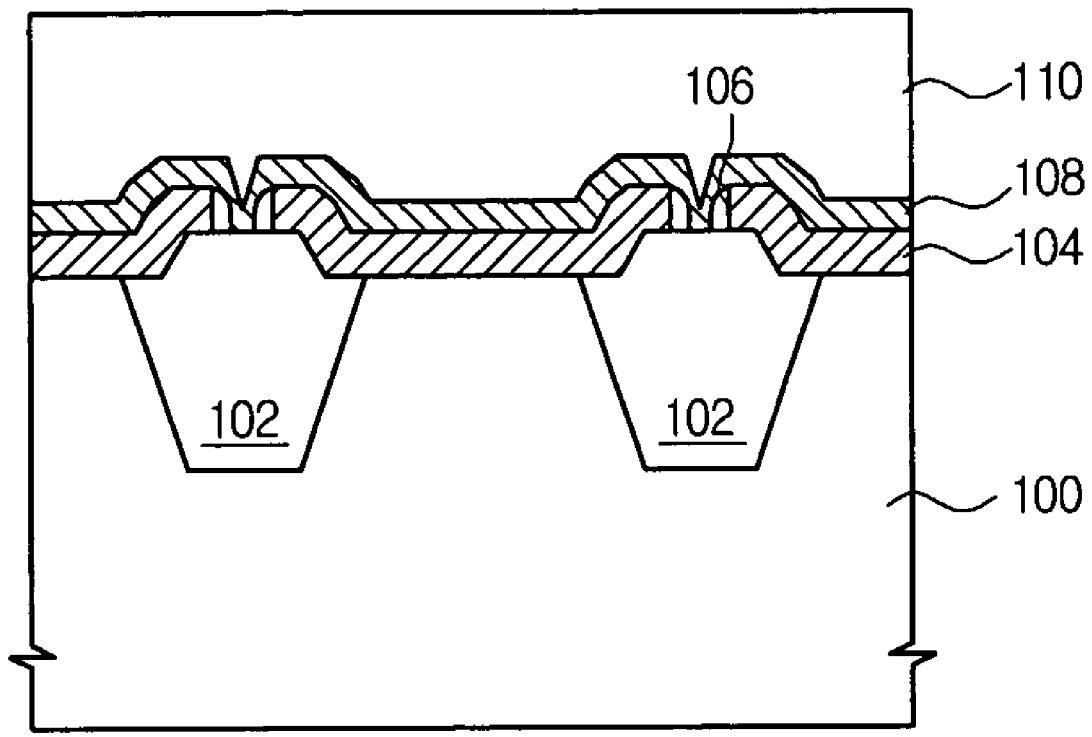

Referring to FIGS. 10 and 14, an interlayer insulating layer 108 and a control gate 110 are sequentially formed on the floating gate 104 and the sidewall gate 106. The interlayer insulating layer 108 may be formed of an oxide/nitride/oxide (ONO) layer. The control gate 110 is formed by depositing a conductive layer on an entire surface of the substrate 100 and patterning the deposited conductive layer.

The sidewall gate 106 can prevent the edge region of the floating gate 104 from being protruded sharply. Therefore, the probability that electrons retained in the floating gate 104 will move to the control gate 110 can be reduced. Also, data can be stably retained, thus improving the reliability of the flash memory device.

Figure 15:
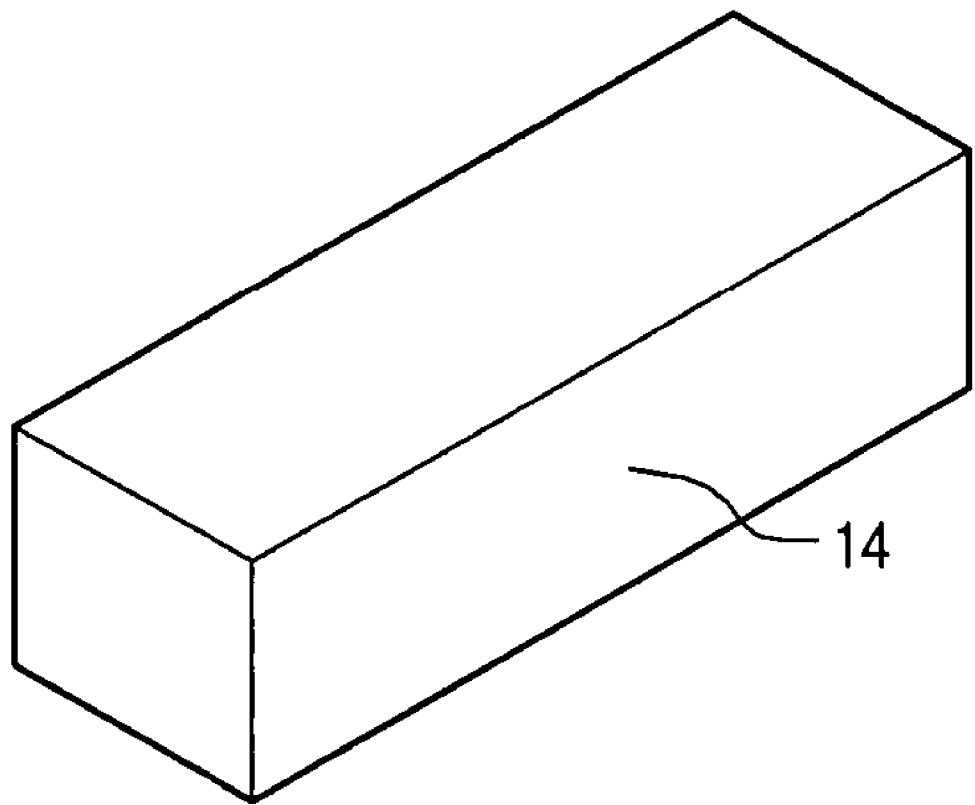
FIG. 15 is a perspective view of a floating gate of the related art flash memory device.

FIG. 15 is a perspective view of a floating gate of the related art flash memory device, and FIG. 16 is a perspective view of a floating gate of the flash memory according to the present invention.

As illustrated in FIG. 15, the floating gate 14 of the related art flash memory device has a rectangular parallelepiped shape. Therefore, the probability that the electrons will move to the control gate at the sharp edge portion of the floating gate is increased. This represents that the electrons retained in the control gate move the control gate, and it also means data loss.

On the contrary, as illustrated in FIG. 16, the flash memory device according to the present invention further includes the sidewall gate 106 formed at the floating gate 104. The edge portion of the floating gate 104 is not sharp but relatively smooth. Therefore, the electrons retained in the floating gate 104 can be prevented from moving to the control gate 110 at the edge portion of the floating gate 104. Consequently, the reliability of the data retention can be improved.

Also, the flash memory device according to the present invention can improve a coupling ratio by forming the sidewall gates 106 at the sidewalls of the floating gate 104.

It will be apparent to those skilled in the art that various modifications and variations can be made in the present invention. Thus, it is intended that the present invention covers the modifications and variations of this invention provided they come within the scope of the appended claims and their equivalent.

What is claimed is:

1. A flash memory device comprising:
    a floating gate formed on a substrate;
    first sidewall gates formed on sidewalls of the floating gate;
    an interlayer insulating layer formed on the floating gate and the sidewall gates;
    a control gate formed on the interlayer insulating layer;
    trench insulating layers formed in the substrate to thereby define an active region therebetween;
    a selection gate formed on the trench insulating layers; and
    second sidewall pates formed at sidewalls of the selection gate.

2. The flash memory device according to claim 1, wherein the substrate is formed of silicon.

3. The flash memory device according to claim 1, wherein the first and second sidewall gates are formed of polysilicon.

4. The flash memory device according to claim 1, wherein the interlayer insulating layer is formed of an oxide/nitride/oxide (ONO) layer.

5. The flash memory device according to claim 1, wherein the first sidewall gates prevent the edge region of the floating gate from being protruded sharply to reduce the probability of electrons from moving from an edge portion of the floating gate to the control gate.

6. The flash memory according to claim 5, wherein the edge portion of the floating gate is not sharp but relatively smooth.

7. A fabricating method of a flash memory device, comprising:
    forming trench insulating layers in a substrate for defining an active region;
    forming a floating gate on the substrate;
    forming a selection gate on the trench insulating layers;
    forming sidewall gates at sidewalls of the floating gate and sidewalls of the selection gate;
    forming an interlayer insulating layer on the floating gate and the sidewall gates; and
    forming a control gate on the interlayer insulating layer.

8. The fabricating method according to claim 7, wherein the substrate is formed of silicon.

9. The fabricating method according to claim 7, wherein the sidewall gates are formed of polysilicon.

10. The fabricating method according to claim 7, wherein the interlayer insulating layer is formed of an oxide/nitride/oxide (ONO) layer.

11. The fabricating method according to claim 7, wherein the sidewall gates prevent the edge region of the floating gate from being protruded sharply to reduce the probability of electrons from moving from an edge portion of the floating gate to the control gate.

12. The fabricating method according to claim 7, wherein the forming of the sidewall gate includes:
    forming a polysilicon layer on the floating gate;
    forming a patterned mask on the polysilicon layer; and
    forming the sidewall gates by an etching process using the patterned mask.

13. The fabricating method according to claim 11, wherein the edge portion of the floating gate is not sharp but relatively smooth.

14. The fabricating method according to claim 12, wherein the patterned mask is formed of a photoresist layer.

* * * * *